(12) United States Patent  (10) Patent No.: US 8,486,291 B2
Ohmori et al.  (45) Date of Patent: Jul. 16, 2013

(54) PLASMA PROCESSING METHOD

(75) Inventors: Takeshi Ohmori, Tachikawa (JP);
Yasuhiro Nishimori, Hikari (JP);
Hiroaki Ishimura, Kudamatsu (JP);
Hitoshi Kobayashi, Kudamatsu (JP);
Masamichi Sakaguchi, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 176 days.

(21) Appl. No.: 13/011,070

(22) Filed: Jan. 21, 2011

(65) Prior Publication Data

US 2012/0125890 A1 May 24, 2012

(30) Foreign Application Priority Data

Nov. 19, 2010 (JP) .................................. 2010-258466

(51) Int. Cl.
*C03C 15/00* (2006.01)
(52) U.S. Cl.
USPC ............ 216/67; 134/1.1; 134/2; 134/31; 156/345.1; 438/709; 438/725
(58) Field of Classification Search
USPC .............. 216/67; 438/727, 730, 905; 134/1, 134/1.1, 2, 31, 22.1; 156/345
See application file for complete search history.

(56) References Cited

U.S. PATENT DOCUMENTS

| 6,186,153 | B1 | 2/2001 | Kitsunai et al. | |
| 6,379,575 | B1 * | 4/2002 | Yin et al. | ........................ 216/67 |
| 8,114,244 | B2 * | 2/2012 | Hirota et al. | ............. 156/345.27 |

FOREIGN PATENT DOCUMENTS

| JP | 10-233388 | 9/1998 |
| JP | 10-261623 | 9/1998 |
| JP | 2010-16213 | 1/2010 |
| KR | 10-2007-0068556 | 7/2007 |
| KR | 10-2009-0086351 | 8/2009 |

OTHER PUBLICATIONS

Korean Official Action issued on Jan. 30, 2012, for KR Application No. 10-2011-0006328.

* cited by examiner

*Primary Examiner* — Nadine Norton
*Assistant Examiner* — Maki Angadi
(74) *Attorney, Agent, or Firm* — Antonelli, Terry, Stout & Kraus, LLP.

(57) ABSTRACT

In the present invention, provided is a plasma processing method which reduces or eliminates the emission of contaminating matters caused by a quality-altered layer on the surface of yttria of a processing chamber's inner wall and parts inside the processing chamber. It is the plasma processing method including an etching step of setting a sample inside the processing chamber, and etching the sample, a deposition-product removing step of removing a deposition product by using a plasma, the deposition product being deposited inside the processing chamber by the etching step, the plasma being generated using a gas which contains fluorine or chlorine, and a step of exposing, to a rare-gas-based plasma, the inside of the processing chamber after the deposition-product removing step.

9 Claims, 4 Drawing Sheets

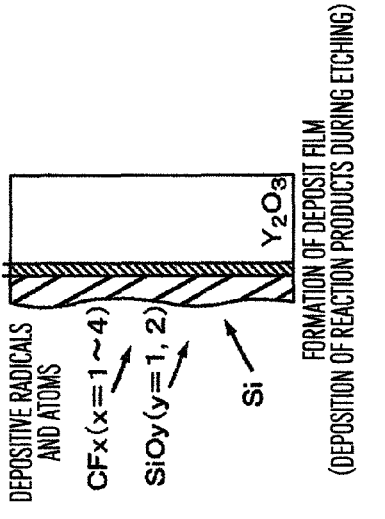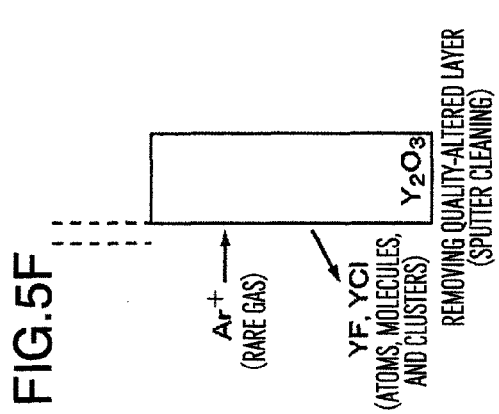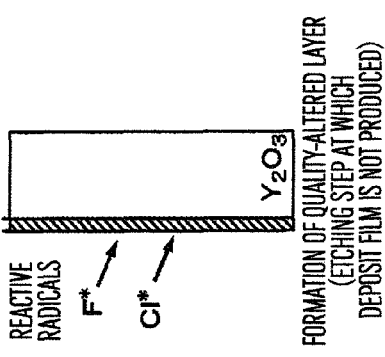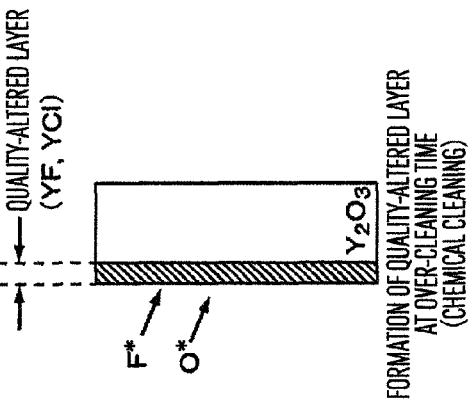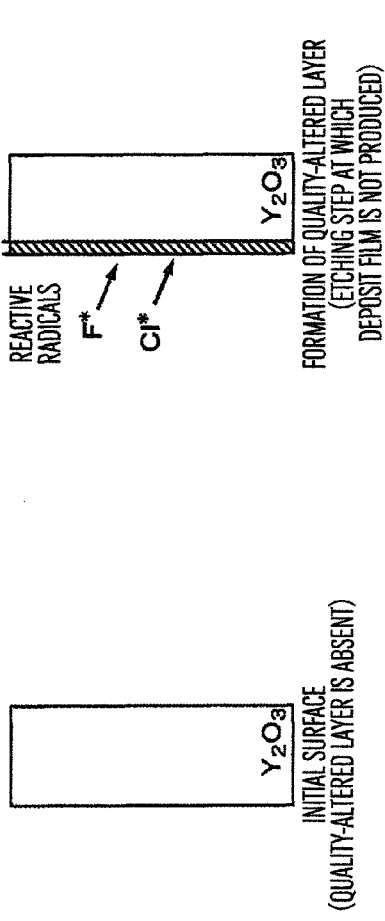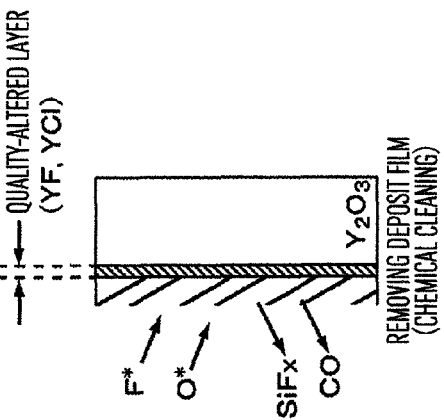

PLASMA PROCESSING METHOD

BACKGROUND OF THE INVENTION

The present invention relates to a plasma processing method using a plasma processing apparatus. More particularly, it relates to a plasma cleaning in the plasma processing method.

In order to enhance the productivity of semiconductor devices in the semiconductor processing field, it is requested that, in the plasma etching, the dropping of microscopic particles onto a microminiaturized structure fabricated on a wafer is reduced to the minimum possible degree. The mechanisms of the emission of the particles are explained as follows. Deposition film formed during wafer processing on the inner-wall surface of a processing chamber and on parts inside the chamber is re-injected onto the wafer. Or the material itself constituting the surface of the inner-wall and the parts is emitted and dropped onto the surface of the wafer. In view of this situation, as measures for reducing the emission of the microscopic particles, the following method or configuration is devised and used. Namely, a plasma cleaning method for removing the deposited film can be used. Otherwise, a material which can prevent the emission of the microscopic particles is used as the inner-wall surface and the inside parts of a processing chamber.

As the conventional technology for reducing the emission of the microscopic particles, there exists the method of applying the plasma cleaning to the deposited film after the wafer processing. In JP-A-10-261623, the emission of the microscopic particles is reduced as follows. Namely, in addition to the conventional plasma-cleaning-based method of removing deposited films, the emission of the microscopic particles is reduced by using a plasma which is capable of chemically decomposing and removing a chemical compound formed between the inner-wall material released into the processing chamber and a processing gas used. Also, in JP-A-10-233388, the emission of the microscopic particles is reduced as follows. Namely, after the deposited-film removing step is over, the emission of the microscopic particles is reduced by adding a step that releases the reaction product of residual adsorbed gases from the inner-wall surface into the processing chamber. Here, this releasing operation is performed by exposing the inner-wall surface to plasma for a short time of a few hundreds of milliseconds to a few seconds.

In mass production of the devices, the amount of deposit material or the chemical compound which is formed from the processing chamber's inner-wall material and the processing gas is increased with increasing the time of the continuous processing of wafers. As a result, the number of the microscopic particles is increased. In order to address this problem, the apparatus is disassembled, and the washing or replacing operation for the processing chamber's inner-wall parts is carried out. In order to restart wafer processing after these operations, however, the start-up of the processing chamber takes a few hours to about a day. In addition, the start up time decreases the productivity of the devices. Accordingly, it is requested to provide a plasma processing apparatus or plasma-processing operating method which makes it possible to continue the plasma processing over a longer time in a state where the number of the microscopic particles is small.

On the surface of the wafer, there exist an area where the microminiaturized structure is fabricated with high density and an area of that with low density. When the microscopic particles drop onto the area of the low density of the structure, the dropped microscopic particles exert only a little influence on a decrease in the yield of the device. This situation holds as long as the microscopic particles are sufficiently smaller as compared with the structure. Meanwhile, when the microscopic particles drop onto the area of the high density of the structure, it becomes highly possible that the yield decreases with the worsening of the etching profile under the dropped particles. Also, the worsened area is enlarged in proportion to the size of the particles and the yield decreases. Consequently, with the development of microminiaturization in a semiconductor processing in recent years, it is requested that the number of the microscopic particles which will drop onto a wafer and the diameter of the particles are decreased as small as possible.

As described above, one of the causes for the emission of the microscopic particles is as follows. Namely, the processing chamber's inner-wall material is sputtered by the plasma used. Then, the sputtered inner-wall material is released into the processing chamber as the microscopic particles. Accordingly, it is preferable that a material which has tremendously high resistance to the plasma sputtering is employed as the processing chamber's inner-wall material. In view of this situation, in recent years, there has been more employment of the following new plasma-resistant materials: a sprayed-on product or sintered body of yttria (which, hereinafter, will be referred to as "$Y_2O_3$"), and $Y_2O_3$ or alumina ($Al_2O_3$) to which a trace amount of various elements such as zirconia is added for the purpose of enhancing the plasma-resistant property.

SUMMARY OF THE INVENTION

Employing these new materials with excellent resistance to plasma as the processing chamber's inner wall, its high plasma-resistant property allows mass production processing of the wafers to be started in a state where the number of the microscopic particles is reduced to an exceedingly small number. As the number of the processed wafers increases, however, atoms and molecules, which consist of the processing chamber's inner wall, are gradually released by being sputtered from the surface even though they are a few. In the materials such as $Y_2O_3$, there exist boundaries such as a crystalline interfacial plane or lamellar structure, which is formed at the time of making the material surface. Then, if the release of the atoms and molecules from the surface is continued, microscopic particles at the size of a few tens of nanometers or greater along these boundaries are released into the processing chamber and drop onto the wafer. Moreover, with the increasing in the number of processed wafers, the number of the microscopic particles increases gradually. An investigation was conducted on the number and chemical composition of the microscopic particles dropping onto the wafers as a function of the number of the processed wafers, which has revealed the following fact. Namely, the cause for the increase in the number of the microscopic particles is that the surface of the inner-wall material is altered by a phenomenon that the reactive gases for wafer processing come into contact and react with the surface of the inner-wall material. In addition, the investigation has also revealed that this quality-altered region expands with the increase in the number of the processed wafers and the expansion causes the number of the emission of the microscopic particles to increase. Also, the investigation has revealed that the expansion of this quality-altered region increases the emission of the microscopic particles that occurs along the above-described boundaries existing inside the materials such as $Y_2O_3$. As the density of the gas which has the reactivity with the inner-wall material is higher, or as the collision frequency between this reactive gas and the surface of the material is higher, this quality-altered region expands more. As a result, as illustrated in FIG. 1, the quality-altered layer expands into the inside of the material. In many cases, this quality-altered layer exhibits a comparatively high plasma-resistant property. Although, this property of plasma-resistant is lower than that of the original unaltered surface. And the lower property makes emission of the particles increase as compared with that of the original surface. Also, in many cases, there exists none of plasmas which are capable of chemically decomposing and removing this quality-altered layer. Even if there exists a gas species whose plasma is capable of chemically decomposing and removing the quality-altered layer, it is mostly difficult to use the plasma due to its too high reactivity with the material of a wafer stage and the surface of the parts other than the quality-altered surface in the chamber.

The above-described phenomena occur in case when $Y_2O_3$ is employed as the inner-wall material and a gas which contains fluorine (F) or chlorine (Cl) is employed as a plasma-etching gas or plasma-cleaning gas. Hereinafter, the concrete explanation will be given concerning the above-described phenomena. Namely, $Y_2O_3$, which has the high plasma-resistant property, makes it possible to reduce the emission of the microscopic particles during the wafer processing. With the increase in the number of the processed wafers, however, oxygen contained in $Y_2O_3$ is gradually replaced by fluorine or chlorine in the processing gas. In this way, $Y_2O_3$ becomes YF, YOF, YCl, or YOCl, and thus the fluoride or chloride reaction proceeds. Namely, the quality of the original $Y_2O_3$-composed inner-wall material is altered by the reaction through which the atomic density of fluorine or chlorine increases inside the inner-wall material. As explained earlier, the quality-altered layer by the fluoride or chloride reaction becomes the cause for the increase in the number of the emission of the microscopic particles. Also, the quality-altered region is widened and deepened further by an increase in the number of times of contact between the $Y_2O_3$ surface and the fluorine or chlorine gas (refer to FIG. 1).

From the above-described explanation, in order to reduce the number of the emission of the microscopic particles with increasing in the number of the processed wafers, it is necessary to eliminate the influences of the quality-altered layer as much as possible. Here, the quality-altered layer is formed on the surface of $Y_2O_3$ of the processing chamber's inner wall and the parts inside the processing chamber. Accordingly, an object of the present invention is to provide a plasma processing method which makes it possible to reduce or suppress the emission of contaminating matters caused by the quality-altered layer.

In the present invention, there is provided a plasma processing method using a plasma processing apparatus where the material constituting a processing chamber's inner wall, or the material constituting inside parts of the processing chamber is composed of yttria, the plasma processing method including an etching step of etching a sample with setting the sample inside the processing chamber, a deposition-product removing step of removing a deposition product deposited inside the processing chamber in the etching step by using plasma which is generated by using a fluorine or chlorine contained gas, and a step of exposing the surface of the inside of the chamber to a rare-gas-based plasma after the deposition-product removing step.

Applying the plasma processing method of the present invention makes it possible to suppress or reduce the emission of contaminating matters caused by the quality-altered layer which is formed on the surface of the $Y_2O_3$ parts and the inner wall in the plasma processing apparatus.

Other objects, features and advantages of the invention will become apparent from the following description of the embodiments of the invention taken in conjunction with the accompanying drawings.

BRIEF DESCRIPTION OF THE DRAWINGS

FIGS. 5A to 5F are diagrams for illustrating overviews of the surface material of the inner-wall and parts inside the chamber of the processing apparatus at the time when the plasma processing method according to the present invention is applied.

DESCRIPTION OF THE INVENTION

Figure 2:
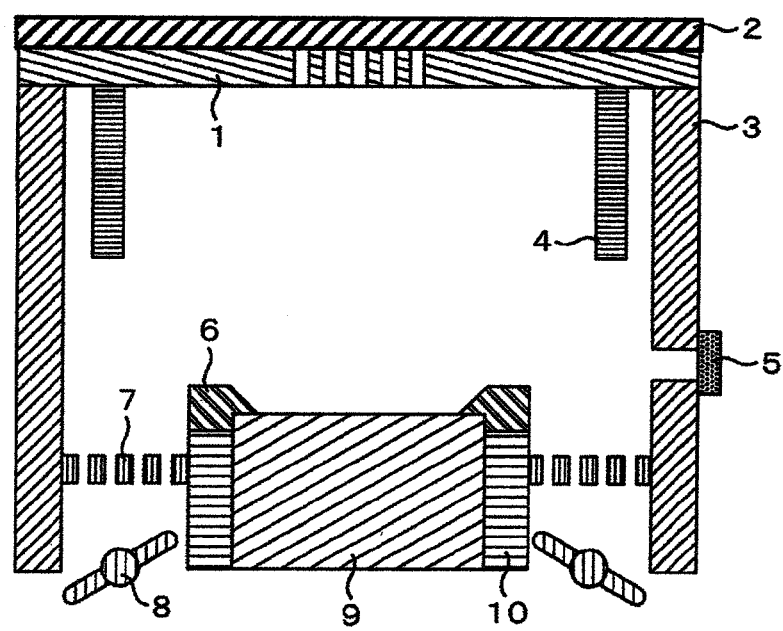
FIG. 2 is a schematic diagram of the cross section of the processing chamber in a plasma processing apparatus to which the present invention is applied.

Hereinafter, referring to the drawings, the explanation will be given concerning an embodiment of the present invention. FIG. 2 is a schematic diagram of the cross section in the processing chamber of a plasma etching apparatus to which the present invention is applied. The above-described processing chamber includes (not illustrated) the units for generating plasma such as antenna, solenoid coil, and waveguide. Using these units, the plasma is generated and sustained in the processing chamber. Also, a sample stage 9 for mounting a wafer thereon is set up inside the processing chamber. Locations which are exposed to the plasma around the sample stage 9 inside the processing chamber are the ones such as the surface of the sample stage 9, a susceptor 6, and a sample-stage cover 10. In order to enhance the plasma-resistant property, $Y_2O_3$ is used at these locations. The processing chamber is sealed into a vacuum state by an inner wall 3 and a ceiling plate 2. A processing gas is introduced into the processing chamber via a shower plate 1 with holes. The plasma is generated by using the processing gas introduced into the processing chamber and a radio-frequency electric power supplied by the plasma-generating units. The inner wall 3 and the shower plate 1 are exposed to the plasma. Accordingly, either one of the inner wall 3 or shower plate 1 is manufactured by using $Y_2O_3$. Or either one of the surface is coated by using $Y_2O_3$. The inner wall 3 which is exposed to the plasma can be also covered by an inner cylinder (not illustrated) or a liner (not illustrated). In this case, the $Y_2O_3$-coating is applied onto the surface of the inner cylinder or the liner. Also, the inner cylinder or the liner itself may be manufactured using the $Y_2O_3$ material. When the inner cylinder or the liner is used as a cover of the inner wall 3 where exposed to the plasma, the covered inner wall 3 is not necessary to be manufactured by using $Y_2O_3$.

The other locations which are exposed to the plasma inside the processing chamber are the ones such as the surfaces of a segregation wall 4 for confinement of the plasma, a wafer transfer gate 5, a baffle plate 7 for preventing the diffusion of the plasma, and pressure control valves 8. In the present embodiment, the $Y_2O_3$-coating is applied onto the surfaces of the segregation wall 4 and the baffle plate 7, or these are manufactured by using the $Y_2O_3$ material. Applying the $Y_2O_3$-coating onto the surfaces of the wafer-transferring gate 5 and the pressure control valves 8 as well makes it possible to further enhance the effect of reducing the emission of the contaminating matters caused by the microscopic particles as compared with that without the $Y_2O_3$-coating.

Figure 3:
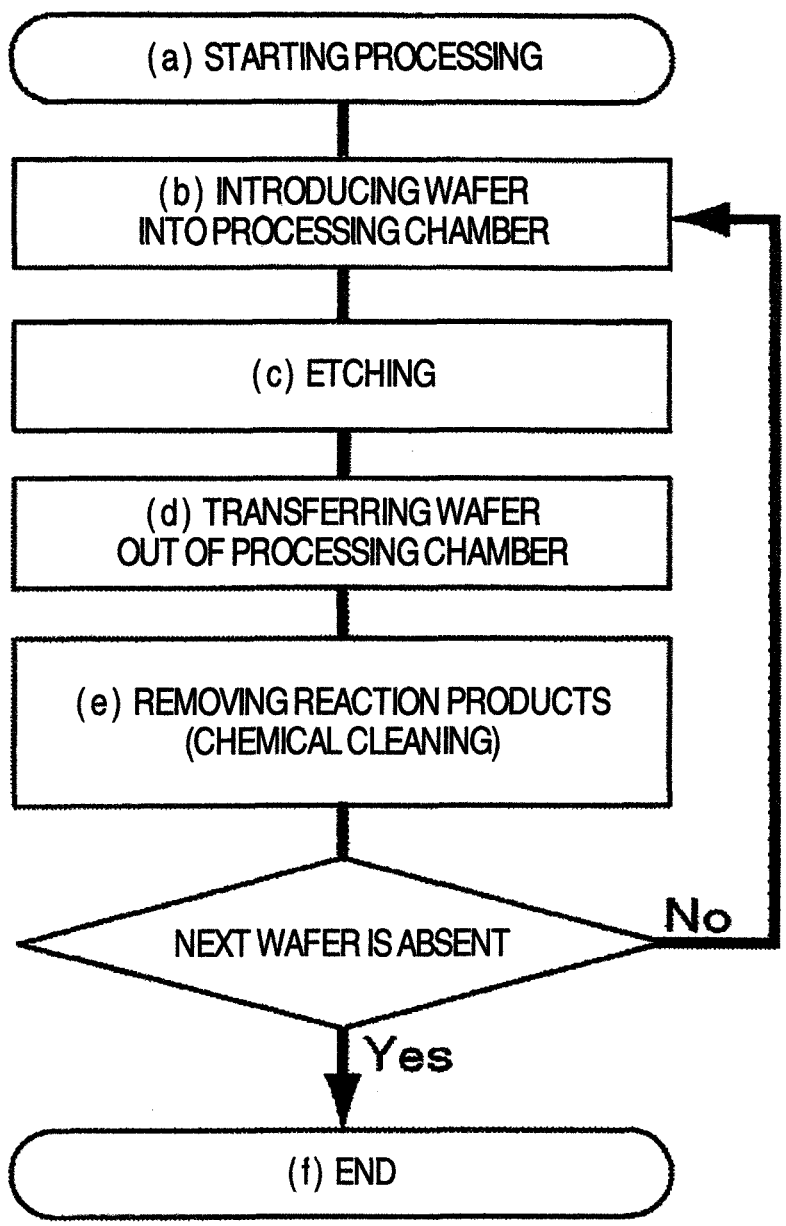
FIG. 3 is a diagram for illustrating processing steps of the plasma processing method according to the prior arts.

Next, the explanation will be regarding a plasma processing method in the above-described plasma etching apparatus. First, FIG. 3 illustrates the processing steps of the plasma processing method of wafers according to the prior arts. As described earlier, a material of high plasma resistance such as $Y_2O_3$ is used at the locations that are exposed to the plasma inside the processing chamber. And a film is deposited on the surface of the processing chamber's inner wall (Step (c) in FIG. 3). This deposit film is composed with such as a reaction product released from the wafer, sticking radicals generated in the process gas, and a chemical compound of the inner-wall material released into the processing chamber by plasma sputtering and the reactive processing gas. These deposit films cause the emission of the microscopic particles. Consequently, after the wafer has been transferred out form the processing chamber (Step (d) in FIG. 3), the deposit films are removed by the step of plasma cleaning (Step (e) in FIG. 3). A typical method of removing deposit films is the plasma cleaning with utilizing chemical reactions (i.e. chemical cleaning).

Figure 4:
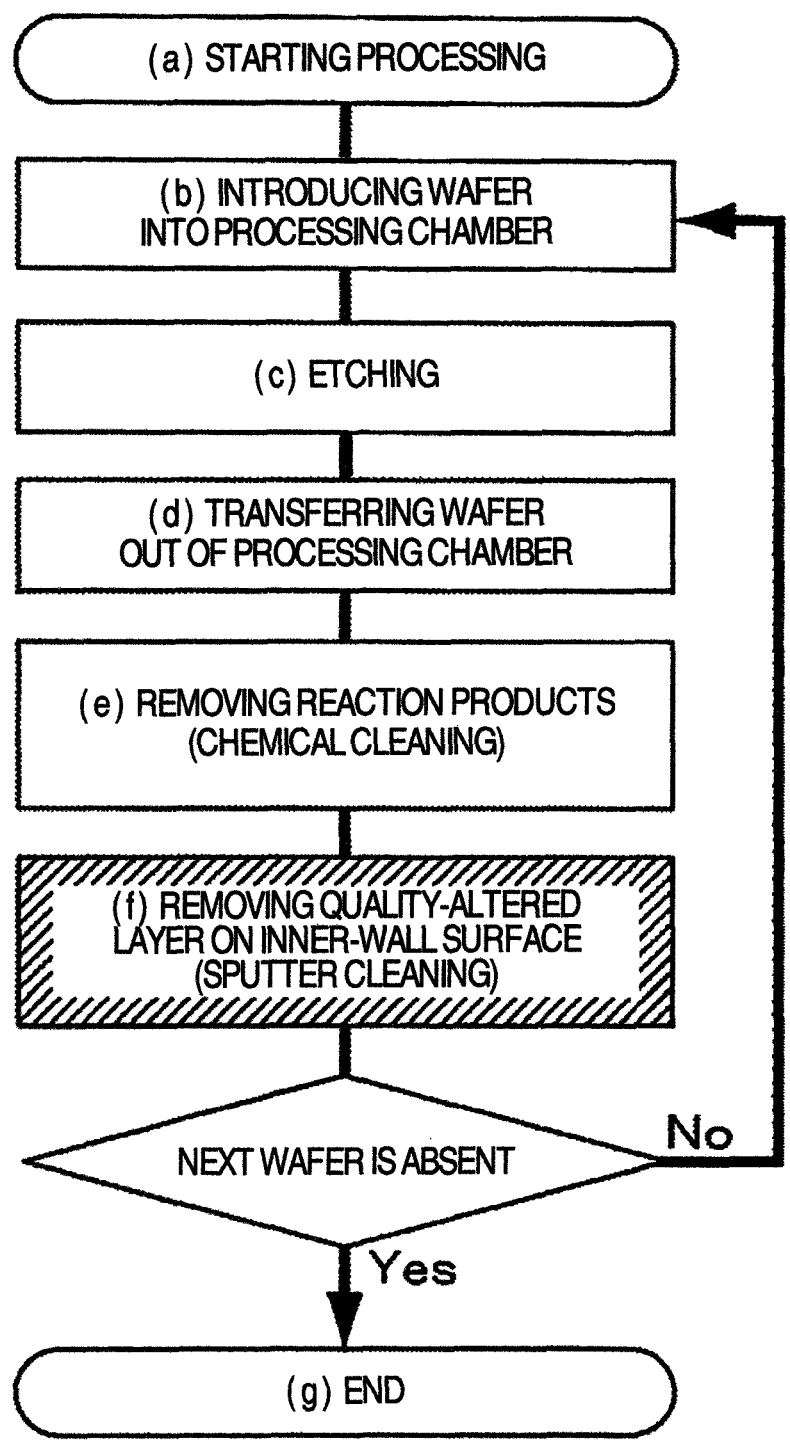
FIG. 4 is a diagram for illustrating processing steps of the plasma processing method according to the present invention.

Meanwhile, as illustrated in FIG. 4, the plasma processing method according to the present invention adds a step of removing the quality-altered layer (Step (f) in FIG. 4) to the prior arts (FIG. 3).

At this step of removing the quality-altered layer, a plasma is generated by using a gas (e.g., rare gas) which has no chemical reactivity with the original material and will not increase the quality-altered layer. And it is necessary to expose the inner-wall surface with this plasma for three seconds or more. A three-second-or-less exposure makes it impossible to remove the quality-altered layer because the etching rate based on the rare-gas plasma is exceedingly low. Also, if the film is not formed on the surface during the wafer processing, it is allowable to omit the plasma cleaning step (Step (e) in FIG. 4) for removing the deposit film.

Next, referring to FIGS. 5A to 5F, the explanation will be given concerning the principle of the present invention. Here, FIGS. 5A to 5F illustrate overviews of the surface state of the apparatus's inner-wall material with applying the present invention. In FIGS. 5A to 5F, $Y_2O_3$ has been employed as the inner-wall material. Moreover, a gas contains at least fluorine (which, hereinafter, will be referred to as "F") or chlorine (which, hereinafter, will be referred to as "Cl") has been employed as a processing gas which forms the quality-altered layer. Furthermore, as the gas for removing quality-altered layer, argon (which, hereinafter, will be referred to as "Ar") gas has been employed. Also, the conditions specified at the step of removing quality-altered layer are Ar gas at a flow rate of 240 ccm, a pressure inside the processing chamber of 0.5 Pa, and a power of 1000 W for plasma generation.

In recent years, in order to enhance the productivity in the plasma etching, it is a mainstream that a multilayer film deposited on a wafer is consistently etched in a single processing chamber. In order to optimize the etching profile in each layer in the film, it is necessary to choose a suitable etching step (etching conditions) for each layer. In the etching of one layer in the multilayer film, there are also several steps such as a breakthrough step at the beginning of the etching, a main etching step for etching most of the remaining in the layer, and an over etching step for removing the remaining after the main etching. Of these respective etching steps, if the reactive gas of F or Cl is present in the plasma at the etching step without the deposit film on the surface, the surface layer of the $Y_2O_3$ material is altered into YF or YCl (FIG. 5B) by a contact with the reactive radicals. Moreover, if deposition substances are generated in the plasma at the next etching step, the deposit film is formed on this quality-altered layer (FIG. 5C). Furthermore, if the deposit film is removed by the reactive plasma which contains F or Cl at latter step, the formation of the quality-altered layer is expanded again. Accordingly, the formation of the quality-altered layer (FIG. 5B) and the deposit film (FIG. 5C) are repeated at the inner-wall surface in the etching of the multilayer film.

After the above-described etching of the multilayer film has been completed, the deposit film often remains on the entire or a partial area of the inner wall 3 of the processing chamber. In order to remove this deposit film, the plasma cleaning is performed after the wafer has been transferred out from the processing chamber. In this plasma cleaning processing, first, the deposit film is removed by a chemical cleaning (FIG. 5D). Usually, this deposit film differs in its thickness depending on its location in the chamber. Meanwhile, in order to remove the deposit film on the entire area in the chamber, a processing time of the chemical cleaning needs long enough for cleaning of the thickest position of the film. Therefore, the position of the surface of the thin film results to be cleaned excessively (FIG. 5E). In case of difficulty to determine the exact time for the plasma cleaning, it is acquired to add a predetermined time to the estimated time for completion of removing the deposit film. The excessive time in the plasma cleaning is generally referred to as "over cleaning". Because the plasma contains reactive gases such as F or Cl is frequently used in the chemical cleaning, the quality-altered layer is formed in the over cleaning as well. In the present invention, the quality-altered layer is exposed to Ar-gas-based plasma which has no chemical reactivity with the original material under the quality-altered layer after the chemical cleaning. The Ar gas may be replaced by another rare gas. Applying the sputter cleaning onto the quality-altered layer by Ar-gas-based plasma leads the layer release into the processing chamber as YF or YCl. Then, YF or YCl is exhausted to the outside of the processing chamber. This sputter-cleaning processing allows the removal of the quality-altered layer (FIG. 5F). YF or YCl will never be formed in over cleaning with Ar-gas-based plasma after the removal of the quality-altered layer even the $Y_2O_3$ material is sputtered. Meanwhile, when the plasma processing method according to the prior arts (FIG. 3) is applied in the plasma processing chamber which employs a high-plasma-resistant-property material such as $Y_2O_3$, mass production processing of the wafers to be started in a state where the number of the microscopic particles is reduced to an exceedingly small number. However, the number of the microscopic particles increases with the number of the processed wafer. The mechanism of the increase of the microscopic particles is as follows. Namely, when the processing is continued by the method according to the prior arts (FIG. 3), the processing steps of FIG. 5B to FIG. 5E are repeated.

Figure 1:
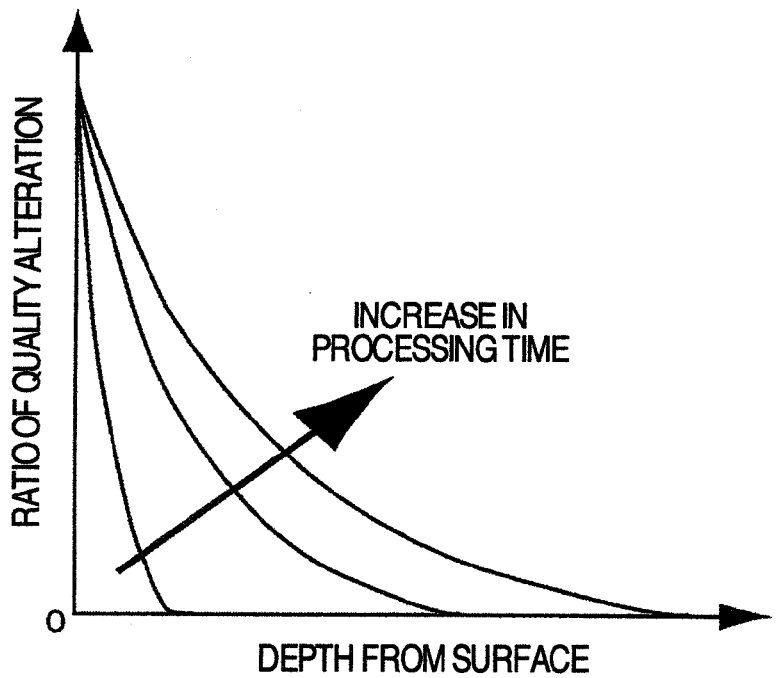
FIG. 1 is the diagram for illustrating expansion of the quality-altered region as a function of a time of mass production.

As a consequence, at the time of the etching step at which the deposit film is not formed and at the time of the over cleaning in chemical cleaning, the atoms constituting the surface of the processing chamber material are gradually replaced by the reactive gas, and the quality-altered layer is formed. Furthermore, this quality-altered region is expanded and deepened with increasing in the time of mass production (refer to FIG. 1).

From the above-described explanation, in order to reduce the emission of the number of the microscopic particles with increasing in the number of the processed wafers, it is effective to remove as much as possible the quality-altered layer formed inside the processing chamber. In the present invention, the sputter cleaning for removing the quality-altered layer is performed as is illustrated in FIG. 5F.

This feature makes it possible to reduce the emission of the microscopic particles with increasing in the number of the processed wafers.

Moreover, in the present invention, it is possible to prevent a quality-altered layer from expanding further even during removal step of the quality-altered layer. This feature permits to lengthen freely the time for removing the quality-altered layer in correspondence with the time needed for reducing the emission of the microscopic particles. Therefore, the removal of the quality-altered layer in a long period of time can be applied after each processed wafer or several processed wafers. In addition, the productivity can be improved in such a manner that the present invention is applied during an idling time of the processing chamber.

It is desirable that high density ions with high energy are irradiated to the quality-altered layer in the plasma. Accordingly, the processing chamber can employs an additional unit for a generation and sustaining of high density plasma around the widely and deeply altered position. Concretely, a coil for controlling the magnetic-field distribution inside the processing chamber, or a structure for applying the radio-frequency power to a partial area of the inner-wall surface of the processing chamber can be used for the plasma.

Also, in the step of removing the quality-altered layer, the removing rate can be increased by raising the temperature of the surface of the quality-altered layer. This temperature-raising operation is performed by using a heating system (not illustrated) in which such as heater, heating medium, or infrared rays. However, if the temperature of the processing chamber's inner-wall is over raised and lowered, it caused cracks and chippings on the surface of the inner-wall material by the thermal stress and it results in the increase of the microscopic particles. Consequently, it is required to determine the range of the temperature within the thermal resistance of the surface in the step of removing of quality-altered layer.

Also, when the wafer processing is constituted from several steps, and if the emission of the microscopic particles increases after any particular step, the increase of the microscopic particles is prevented by the method as follows: (1) transferred out the wafer from the processing chamber after this particular step, (2) cleaning with present invention, (3) replace its wafer back, (4) continue with the next step.

The cleaning here refers to the chemical and the quality-altered layer cleaning, or the quality-deteriorated-layer cleaning.

It is desirable to set the cleaning time as short as possible. However, a long time for the over cleaning is required in case of difficulty to determine the exact time for completion of the cleaning. However, the quality-altered layer is expanded in proportion to the over-cleaning time as described earlier and the number of the emission of the microscopic particles increases as well. Therefore, the application of the removing method of the quality-altered layer in the present invention, which makes it possible to reduce the emission of the microscopic particles and the formation of the contaminating matters, while applying the longer-time over cleaning simultaneously.

Furthermore, the present invention can also be used to reduce the number of the microscopic particles immediately after the processing chamber is structured. The inside parts for the processing chamber are washed after being manufactured in order to remove adherence substances on the surfaces of the parts. However, even after this washing, the adherence substances cannot be removed completely and thus it turns into the source of the microscopic particles in a wafer processing. Also, the surfaces of these parts have microscopic fragments of the material itself, polished scratches, or surface roughness which occur at the time of manufacture of these parts. These factors are also caused for the emission of the microscopic particles. In addition, the washing process forms the quality-altered layer on the surface of these parts in some cases.

In view of this situation, in order to eliminate the causes for the emission of the microscopic particles in the initial time of the mass production, the following operation is preferable. First, the adherence substances are removed by the step of chemical cleaning with reactive-gas-based plasma before starting the wafer processing after the chamber is structured. Next, the inner-wall is exposed with rare-gas-based plasma such as Ar plasma in order to apply the sputter cleaning. The adherence substances mainly composed of carbon or metallic materials can be removed with a high efficiency by a chemical cleaning. However, it is desirable that the gas for the chemical cleaning will not form the quality-altered layer. If the gas forms the quality-altered layer, it is desirable to make the processing time as short as possible. The number of the microscopic particles can be reduced at the initial time of mass production by removing the surface roughness area and microscopic fragments which is easily released into the processing chamber in rare-gas-based plasma such as Ar plasma after starting the wafer processing. Also, even if the quality-altered layer is formed on the surface of the inside parts and inner-wall of the chamber in the washing process or chemical cleaning, the removal of the quality-altered layer can be achieved as well. The inside parts and inner-wall of the processing chamber is washed after a long period of wafer processing. The washing of the processing chamber refers to as "wet cleaning". The application of the present invention after this wet cleaning as well allows the reduction of the emission of the microscopic particles immediately after the starting of the mass-production processing. Productivity can be maintained by applying the removing process of the quality-altered layer in the idling time of the plasma processing chamber.

Also, in the present embodiment, the removing process of the quality-altered layer can be applied after each processed wafer or several processed wafers.

Also, in the present embodiment, the inner wall 3 which employs $Y_2O_3$ has been mainly explained. Basically, the same effects described above are achieved by applying the present invention to $Y_2O_3$ which is used as the other parts inside the processing chamber, such as the shower plate 1, the segregation wall 4, the susceptor 6, the baffle plate 7, the sample-stage cover 10, the inner cylinder, and the liner.

Also, as long as $Y_2O_3$ is used anywhere including the inner wall 3 or the parts inside the processing chamber described above, basically the same effects are achieved by the present invention.

Also, the application of the present invention allows the reduction or elimination of the microscopic particles increased in proportion to the number of the processed wafers. This feature increases the number of the devices produced from a wafer. Moreover, this feature reduces the time and frequency of washing parts for addressing the increase in the number of the microscopic particles. Thereby, it enhances the productivity per chamber. Furthermore, in the present invention, at the step of removing the quality-altered layer, a gas (e.g., rare gas) which has no chemical reactivity with the original material and will not increase the quality-altered layer is employed. it makes it possible to prevent the quality-altered layer from expanding which causes the emission of the microscopic particles even in the step of removing the quality-altered layer.

This feature permits to lengthen freely the time for removing the quality-altered layer in correspondence with the time needed for reducing the emission of the microscopic particles. Consequently, it is possible to change the time of the removing process in correspondence with the number of the processed wafers.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method using a plasma processing apparatus where material constituting a processing chamber's inner wall, or material constituting inside-processing-chamber parts is composed of yttria, said plasma processing method, comprising:
an etching step of setting a sample inside said processing chamber, and etching said sample;
a deposition-product removing step of removing a deposition product by using a plasma, said deposition product being deposited inside said processing chamber by said etching step, said plasma being generated using a gas which contains fluorine or chlorine; and
a step of exposing, to a rare-gas-based plasma, said inside of said processing chamber after said deposition-product removing step, said rare-gas-based plasma being generated using only a rare gas.

2. A plasma processing method using a plasma processing apparatus where material constituting a processing chamber's inner wall, or material constituting inside-processing-chamber parts is composed of yttria, said plasma processing method, comprising:
an etching step of setting a sample inside said processing chamber, and etching said sample;
a deposition-product removing step of removing a deposition product by using a plasma, said deposition product being deposited inside said processing chamber by said etching step, said plasma being generated using a gas which contains fluorine or chlorine; and
a surface-layer removing step of removing a surface layer by using a plasma, said surface layer being of said processing chamber after said deposition-product removing step, said plasma being generated using only a rare gas.

3. The plasma processing method according to claim 2, wherein
said surface-layer removing step is executed after said deposition-product removing step,
said surface layer of said processing chamber being removed by using said plasma at said surface-layer removing step,
quality of said surface layer being altered when said deposition-product removing step is executed, said plasma being generated using only said rare gas.

4. The plasma processing method according to claim 2, wherein said rare gas is argon gas.

5. A plasma processing method of setting a sample inside a processing chamber, and applying a plasma processing to said sample, inner wall of said processing chamber being composed of yttria, or inside-processing-chamber parts being composed of yttria, wherein
said sample comprises a multilayer film,
said plasma processing method, comprising the steps of:
executing a plasma-etching processing to said sample up to a predetermined film of said sample;
supplying only a rare gas into the inside of said processing chamber after said plasma-etching processing step;
exposing said inside of said processing chamber to a plasma which is generated using only said rare gas; and
executing said plasma-etching processing to said remaining film or films of said sample after said exposure step.

6. A plasma processing method using a plasma processing apparatus where material constituting a processing chamber's inner wall, or material constituting inside-processing-chamber parts is composed of yttria, said plasma processing method, comprising:
an etching step of setting a sample inside said processing chamber, and etching said sample;
a deposition-product removing step of removing a deposition product by using a plasma, said deposition product being deposited inside said processing chamber by said etching step, said plasma being generated using a gas which contains fluorine or chlorine; and
a step of exposing, to a rare-gas-based plasma, said inside of said processing chamber after said deposition-product removing step, said rare-gas-based plasma being generated using a gas which has no chemical reactivity with the yttria and which does not increase a quality-altered layer of the yttria.

7. The plasma processing method according to claim 6, wherein said step of exposing, after said deposition-product removing step, includes raising a temperature of a surface of the yttria inside of said processing chamber.

8. The plasma processing method according to claim 6, wherein said gas which has no reactivity with the yttria and which does not increase a quality-altered layer of the yttria contains argon.

9. The plasma processing method according to claim 6, wherein during said deposition-product removing step, a quality-altered layer of the yttria is produced, which is removed during said step of exposing after said deposition-product removing step.

* * * * *